United States Patent [19]
Nyswander
[11] 3,735,272
[45] May 22, 1973

[54] AUTOMATIC GAIN CONTROL

[75] Inventor: Rueben E. Nyswander, China Lake, Calif.
[73] Assignee: The United States of America as represented by the Secretary of the Navy, Washington, D.C.

[22] Filed: Oct. 20, 1971
[21] Appl. No.: 191,047

[52] U.S. Cl. ..................328/132, 328/146, 328/169, 330/141, 328/127, 307/235, 307/280, 307/230
[51] Int. Cl. ..................H03g 3/20
[58] Field of Search..................307/230, 237, 235, 307/273, 280; 330/141; 328/132, 169, 146, 127

[56] References Cited

UNITED STATES PATENTS

| | | | |
|---|---|---|---|
| 3,119,070 | 1/1964 | Seliger | 328/132 X |
| 3,127,554 | 3/1964 | Kaneko | 307/273 X |
| 3,166,678 | 1/1965 | Fleshman et al. | 307/273 X |
| 3,346,743 | 10/1967 | Strenglein | 307/237 X |
| 3,395,294 | 7/1968 | Sawada | 307/230 X |
| 3,617,777 | 11/1971 | Kudelski | 330/141 X |

*Primary Examiner*—John S. Heyman
*Attorney*—R. S. Sciascia

[57] ABSTRACT

An automatic gain control wherein the gain is maintained at a level just low enough to prevent saturation by noise and clutter. The gain slowly increases at a highly linear rate until a threshold value is exceeded; then the gain is rapidly reduced. Likewise, when a signal exceeding the threshold value is received, the gain is rapidly reduced to maintain a level below saturation.

5 Claims, 2 Drawing Figures

AUTOMATIC GAIN CONTROL

BACKGROUND OF THE INVENTION

In the field of missile guidance systems, certain specialized electronic circuits require devices which automatically control the gain of the circuit, and impose special requirements on those devices. The circuit gain must be confined to a relatively narrow range, large enough to give a suitably large signal if the input is small, but small enough to prevent the circuit from saturating on clutter and noise. Using prior automatic gain control devices, if a typical or even small input, which would be considerably larger than the average noise plus clutter level, suddenly appears the circuit saturates. And, at least a large number of pulse periods will pass before the AGC reduces the gain and takes the circuit out of saturation. That is, the prior AGC devices operate too slowly to be of any benefit in certain applications.

When the circuit is saturated, the true amplitude of the input will be completely obscured and the information obtained will be worthless for comparative analysis. In certain applications the deficiency of the prior art devices occurs at a critical moment. Therefore, the development of an improved automatic gain control device capable of rapidly reducing circuit gain, i.e., on a pulse to pulse basis, was imperative.

SUMMARY OF THE INVENTION

The present invention is a system for automatically controlling the gain of certain electronic circuits used in missile guidance systems. The AGC operates by attenuating unwanted noise and clutter. When noise and clutter reach a predetermined threshold level, the AGC system rapidly decreases the gain. Thus the circuit gain is maintained at a level just low enough to prevent saturation by noise and clutter. Likewise, when an input is applied to the circuit the gain is rapidly reduced to maintain a level below saturation.

The present invention does not have any time constants which vary with input signals. Instead, the gain is reduced within one pulse recurrence period (200 microseconds or less) by any input which exceeds a predetermined level. The rapid reduction of gain is followed, not by a period of constant gain, but by an indeterminate period of slowly increasing gain at a highly linear rate of gain increase. The gain increases until the threshold level is again crossed; and the process repeats.

DESCRIPTION OF THE PREFERRED EMBODIMENT

Figure 1:
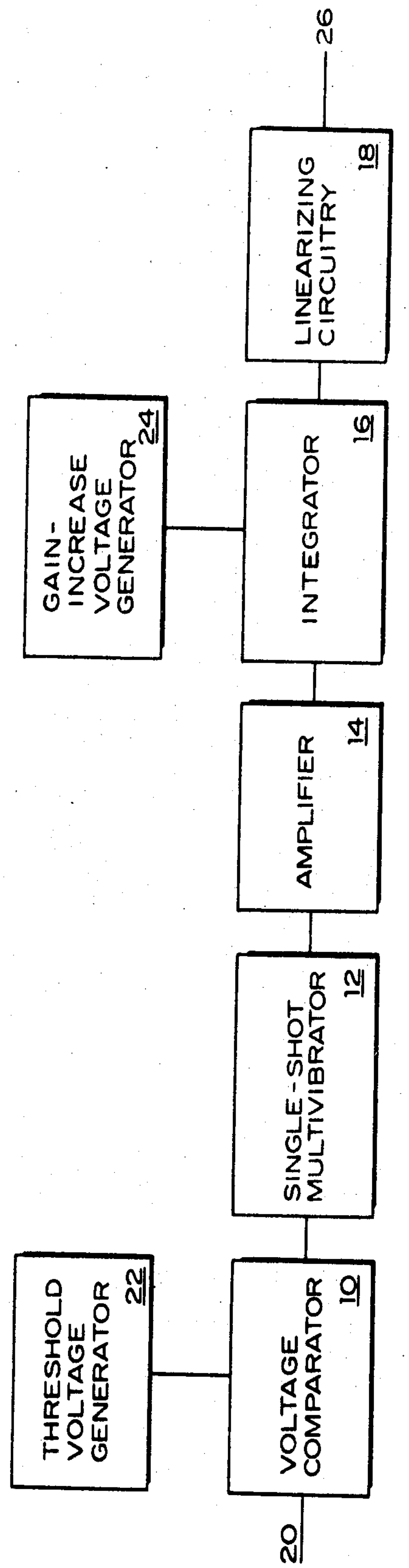
FIG. 1 is a block diagram of the present invention.

A block diagram of the present invention is shown in FIG. 1 and includes voltage comparator 10 for comparing an input signal 20 to the output of an adjustable threshold voltage generator 22. The output of voltage comparator 10 is coupled to single-shot multivibrator 12 which provides an output pulse of predetermined duration if input signal 20 is greater than the output of generator 22. Amplifier 14 clamps the output pulse of multivibrator 12 to a predetermined voltage, amplifies it, and feeds the clamped and amplified pulse to integrator 16. Integrator 16 also receives the output of gain — increase voltage generator 24 which is used to increase the gain at a selectable and linear rate. The output of integrator 16 is then linearized in linearizing circuitry 18 which provides system output 26. When a pulse is generated by multivibrator 12 the system gain is rapidly reduced.

Figure 2:
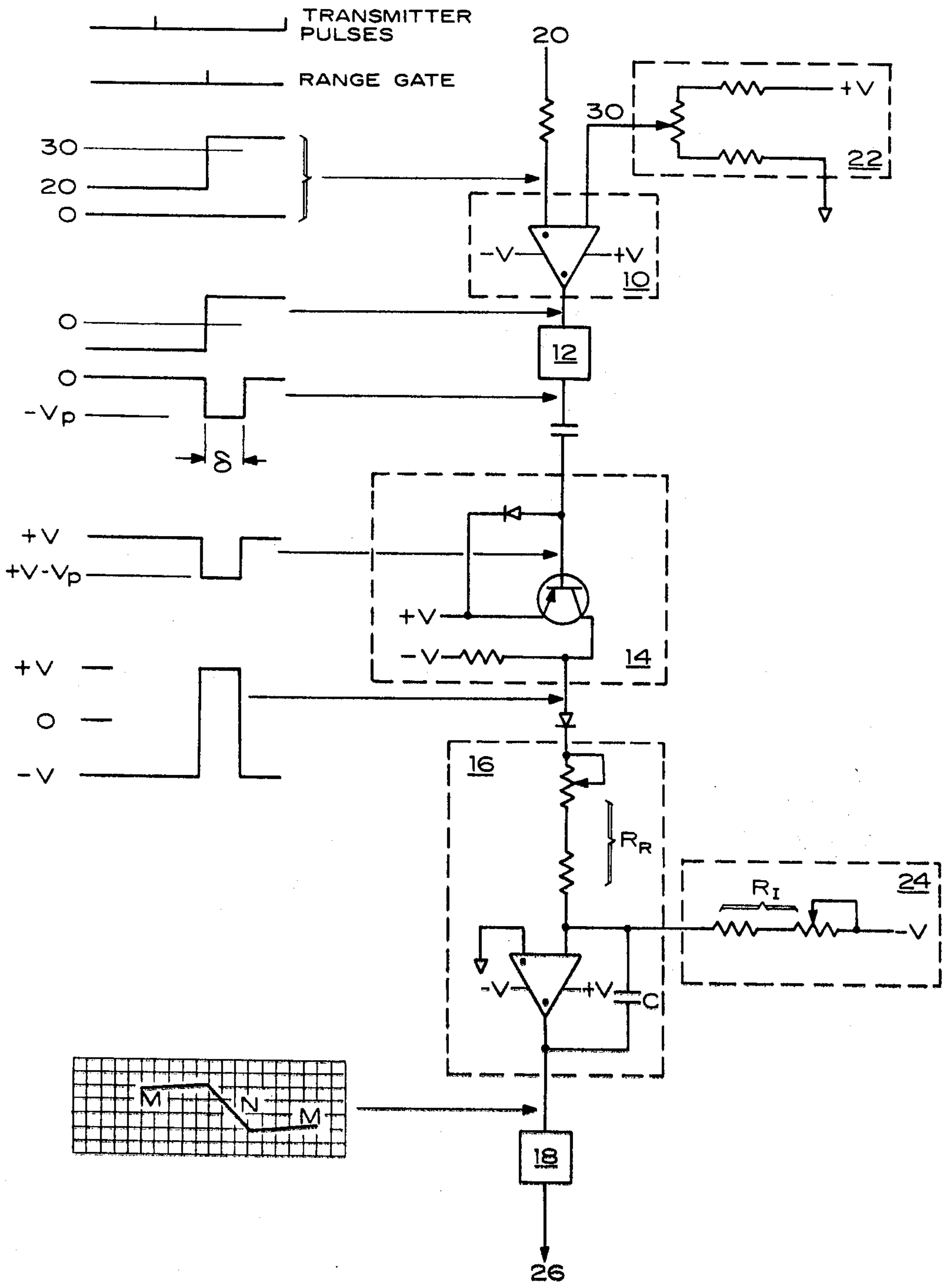
FIG. 2 is a schematic diagram, partially in block form, of the present invention.

The wave forms appearing at significant points in the circuit of the present invention are placed adjacent the schematic diagram of FIG. 2. When input 20 exceeds threshold voltage 30 the output of comparator 10 switches from negative to positive. The switch triggers monostable multivibrator 12. Multivibrator 12 provides an output pulse having duration $\delta$ which is less than a radar pulse recurrence period.

The output is clamped to + V and amplified. The peak - to - peak amplitude of the amplifier output is + V to − V. A diode is coupled to the ouput of amplifier 14 in order to isolate it from the AGC integrator input, which is at zero volts. When a pulse occurs, the diode passes only the portion of the pulse from zero to + V volts, causing the integrator output to decrease for the duration $\delta$ of the pulse.

The gain of the circuit is related to the output of ACG integrator 16 by the relationship $$G = K_1 E_{AGC} + K_2 \text{ , or}$$
$$E_{AGC} = (G - K_2)/K_1 \qquad (1)$$

where $G$ = circuit gain;
$E_{AGC}$ = integrator 16 output voltage,
$K_1$ = AGC scale factor in DB per volt, and
$K_2$ = normal gain when $E_{AGC} = 0$.

The integrator output voltage increases at the following rate, $$(dE_{AGC})/(dT) = V/R_I \times 1/c \qquad (2)$$

Differentiating (1) and equating (1) to (2) gives $$(dE_{AGC})/(dT) = (1)/(K_1)\ (dG)/(dT) = V/R_I \times 1/C \text{ and}$$
$$(dG)/(dT) = (K_1 V)/(R_I C) \qquad (3)$$

Equation (3) gives the normal rate of increase of circuit gain in the absence of a multivibrator pulse.

When a multivibrator pulse occurs, a current flows into integrator 16 through $R_R$. The net current flowing into the integrator for a time, $\delta$, is then $$I_{NET} = V/R_R - V/R_I$$

and the decrease in receiver gain is $$-\Delta G = (K_1\ \delta\ V)/(C)\ [(1\ /R_R - (1\ /R_I)] \qquad (4)$$

The present invention has the advantage of extremely rapid response at the critical moment when an input is first detected. This minimizes the loss of signal information which would normally occur due to circuit saturation, i.e., during the time required by the conventional AGC to reduce circuit gain and bring the signal out of saturation. Thus, the process of signal identification and evaluation can be materially speeded up. Prior to input detection the circuit gain is stable and is maintained in a narrow usable region.

What is claimed is:

1. An automatic gain control for maintaining the gain of an electronic circuit at a level just below that which would cause saturation of the circuit, comprising:

voltage comparing means for comparing an input signal to a reference voltage;

pulse generating means coupled to said voltage comparing means for providing an electronic pulse output of predetermined amplitude and duration when said input signal becomes greater than said reference voltage;

means for clamping the amplitude of said electronic pulse to a predetermined value;

means for amplifying said clamped electronic pulsle; and means coupled to said amplifier means for controlling the gain of said circuit, including means coupled to said gain control means for rapidly reducing the gain of said circuit in response to said amplified, clamped pulse;

such that the rate of gain of said circuit increases at a constant predetermined rate until said input signal becomes greater than said reference voltage, at which time the rate of gain is rapidly reduced during said predetermined duration, and then again increases at said predetermined rate.

2. The control of claim 1 wherein said gain reducing means comprises an integrator.

3. The control of claim 2 wherein said gain control means further includes a gain increasing means having an integrator which includes part of said integrator of said gain reducing means.

4. The control of claim 3 wherein said pulse generating means is a single-shot multivibrator.

5. The control of claim 4 wherein said control further comprises a linearizing circuit coupled to the output of said integrator to compensate for any circuit nonlinearity.

* * * * *